Aug. 19, 1969 E. WOLF ET AL 3,461,552

ELECTRICAL ASSEMBLAGE

Filed Jan. 19, 1966

INVENTORS
Edgar Wolf
Edward H. Lau
Evelyn Berezin
BY [signature]
ATTORNEYS

United States Patent Office 3,461,552

Patented Aug. 19, 1969

3,461,552

ELECTRICAL ASSEMBLAGE

Edgar Wolf, New Hyde Park, Edward H. Lau, Old Westbury, and Evelyn Berezin, New York, N.Y., assignors to Digitronics Corporation, Albertson, N.Y., a corporation of Delaware Filed Jan. 19, 1966, Ser. No. 521,651
Int. Cl. H05k 3/32
U.S. Cl. 29—626 4 Claims

ABSTRACT OF THE DISCLOSURE

An electric circuit assemblage in the form of a board on which are mounted and interconnected electronic components is manufactured by printing a conductive pattern on at least one surface of a board of insulative material. Pins are inserted in the board according to a geometric pattern, with at least some of the pins extending from both surfaces of the board. Some of the pins intersect the conductive pattern. Components, such as integrate circuits having a body portion and leads extending therefrom are positioned against the boards. In particular, the body portions of the components are adjacent one surface of the boards while the leads extend parallel to and longitudinally abut the extending portions of the pins so that the components are maintained in position by the frictional engagement of the leads and pins. The assemblage of the board and pins, and components is dip or wave soldered so that only the component leads and abutting pin portions project into the molten solder. When the assemblage is removed from the molten solder mechanical and electrical connection is established between the leads and adjacent portions of the associated pins.

This invention pertains to the construction of electrical devices, and more particularly, to the physical arrangement of a plurality of electronic components mounted on a card or board which is particularly suited for use in logic circuits. The trend during recent years has been to miniaturize electrical assemblies and to automate their fabrication. Miniaturization has taken great steps forward by the use of solid state devices. Printed circuits have also allowed the expanded use of automated wiring. In fact, miniaturization has proceeded to the point where there are available today devices known as integrated circuits. These integrated circuits are no larger than previously available transistors but contain many logic elements.

There have been proposals for using the usual present techniques for just packaging noninterconnected logic building blocks, such as isolated flip-flops, nands, and other circuits. However, such schemes do not take full advantage of the small size of the integrated circuits. In addition, such schemes result in relatively long signal leads. Long signal leads are undesirable because they are susceptible of noise pickup and have slow signal transmission time. Futhermore, these schemes do not remove the high cost of the many connections and the printed circuit boards of the presents systems. An alternative approach to this type of logic block "Erector Set" arrangement is to assemble the integrated circuits on printed circuit boards to form some logical functional entity. However, this superior approach has its drawbacks. For example, if the number of logic elements exceeds a given quantity it is difficult to design more than a few standard packages for a large system. Even in the manufacture of the packages there is considerable artwork in designing the printed circuit boards. In fact, in larger size packages it is usually necessary to go to costly multilayer printed circuit boards. Furthermore, once the printed circuit boards are designed it is extremely costly to make engineering changes in the circuitry on the boards or to particularize certain of the boards for special applications. It is well known that considerable engineering and layout time is spent in laying out the circuit patterns for the printed circuit master. The only way that this expense can be amortized is in producing large quantities of the boards from the single master. While such production runs are feasible in the radio and television industry, small production runs of non-mass produced equipment generally cannot justify such cost.

It is a general object of the invention to provide an electrical assemblage which has a high component density and is readily susceptible to automatic assembly processes.

It is another object of the invention to provide an electrical assemblage which not only exploits the small size of integrated circuits and printed circuits but also exploits the usual advantages (i.e. speed, low noice) associated with conventional point-to-point wiring.

It is a further object of the invention to provide an electrical assemblage which, while utilizing presently available mass production techniques is highly suitable for specialized deviations from a standard assemblage.

A still further object of the invention is to gain all the advantages flowing from multilayer printed circuits by exploiting an assemblage method which does not require the initial layout design and art work cost generally associated with such circuits.

The invention contemplates a method of making an electrical circuit assemblage by inserting pins, according to a geometric pattern, in a board of insulated material so that at least some of the pins extend from each side of the board. Electrical connections are made between the portions of at least some of the pins extending from one side of the board in accordance with a given circuit pattern. Components having a body and at least a pair of leads are positioned between other portions of pairs of the pins extending from the other side of the board. The components are positioned in such a manner that the body of the component is adjacent to the side of the board and the leads extend away therefrom. The components are maintained in such a position to establish a board-component assemblage. The assemblage is inserted into molten solder so that only the component leads and the portions of the pins adjacent thereto project into the molten solder. The assemblage is removed from the molten solder so that fixed electrical and mechanical connections are established between the leads and the adjacent portions of the associated pins.

The features of the invention are concerned with the types of electrical connections made between the pins in order to provide both for signal and voltage connections.

Other objects, features, and advantages of the invention will be apparent from the following detailed description when read with the accompanying drawing which shows by way of example and not limitation the now preferred embodiment of the invention.

Figures 1, 2:
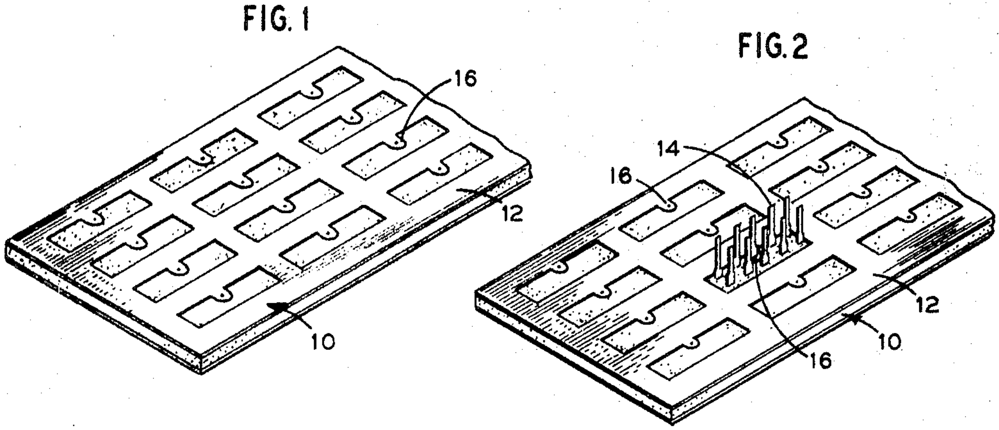
FIGURE 1 shows a perspective view of a component board including printed circuit wiring.
FIGURE 2 shows the component board of FIGURE 1 including pins inserted through the board.
Figure 3:
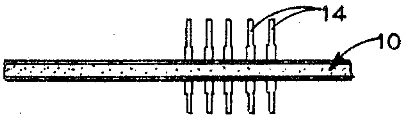
FIGURE 3 shows a side view of the component board of FIGURE 2.

Referring now to the drawings, there is thus illustrated in sequence a process in accordance with the present invention wherein a board, 10, of insulative material such as glass epoxy (G10) has etched thereon patterns for voltage and ground connections. In particular, one side of the board has etched thereon a pattern for an operating voltage distribution and the other side not shown has etched thereon a pattern for the ground connections. In other words, the board 10 is a conventional printed circuit board and by using the conventional printed circuit techniques a pattern of conductive layer is "printed" on each side of the board. For example, as shown in FIGURE 1, the ground pattern 12 of conductive material such as copper is shown. The other side will have the voltage pattern of conductive material printed thereon.

The board is then perforated in a regular geometric pattern which will mate with the geometric positions of the components. The perforations can be performed by either drilling or punching holes. Pins can be inserted into the board so that they pass therethrough. There are first inserted some pins, generally one pin per group array which passes through a printed tab 16. This will be the ground pin for the component. Such pins need not extend from both sides of the board. After these pins are inserted, they may be flow soldered so that they make electrical connection with the printed pattern associated with the common ground pattern or they may be joined by other methods such as hand soldering or forcing the pin into a plated thin hole. All of the remaining pins 14 are then inserted into the board 10. The other side of the board is then flow soldered to perform two functions. It tins all portions of the pins extending from that side and also establishes electrical connection between the pin passing through the tabs printed on said side other side. This establishes electrical connections between the operating voltage pattern and the voltage pins of each group of pins. Hence at this stage of the process, the ground and voltage connections for the component are electically connected to their respective printed circuit patterns.

Figure 4:
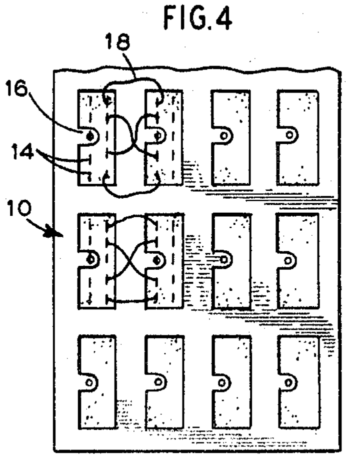
FIGURE 4 shows a bottom view of the component board including wiring between certain of the pins in the board.

Then the portions of the pins extending from the top or ground side of the board as shown in FIGURE 4 are wired to provide the signal or logical interconnections between the components. Wires 18 point-to-point connect the pins 14. The wiring is preferably performed by automatic machinery such as a tape progammed A–MP Termi-Point machine. Concurrently therewith or subsequent thereto, wiring continuity checks are performed to insure that the appropriate connections have been made. It should be noted that these wiring checks are performed before the components are installed to insure that no false continuity readings are obtained due to parallel sneak paths which could be introduced by the components if they were connected. At this stage of the process the assemblage is completely wired except for the components. The fixing of the components to the board now takes place.

Figure 5:
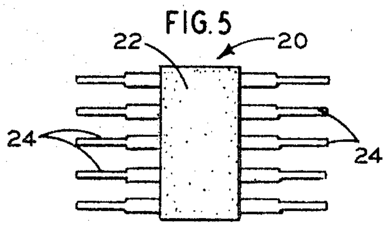
FIGURE 5 shows an enlarged top view of a component having laterally extending leads.
Figure 6:
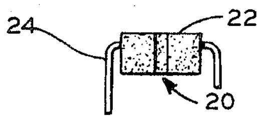
FIGURE 6 shows an end view of the component of FIGURE 5 after the leads have been bent.

A typical component 20 is shown in FIGURE 5. The component 20 is an integrated circuit of the so-called dual in-line configuration having a body 22 and a plurality of leads 24. The laterally extending leads 24 are bent at approximately right angles to the plane of the body 22 as shown in FIGURE 6.

Figure 7:
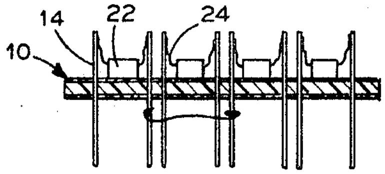
FIGURE 7 shows a side view of the component board after the components have been positioned thereon.

Components 20 are then positioned between mating sets of pins 14 as is shown in FIGURE 7. The leads 24 of the components are bowed slightly outward to abut against the sides of the pins 14. If the resiliency of the leads is sufficient, the component will remain in this position. However, it may be desirable to employ other means to maintain the components 20 in position. A simple solution is to apply a bit of adhesive to the body 22 of the component where it contacts the surface of the board 10. Furthermore, although hand placement of the components is possible, a suitable loading jig and guide can be conveniently employed. In any event, the components are so positioned such that the body of the components rest against or is close to the surface of the board 10 with their leads extending away from the surface and in parallel abutting relationship with the associated pins.

Figure 8:
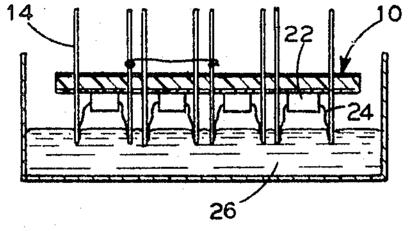
FIGURE 8 is a schematic view of the component board being inserted into a solder bath.

At this stage of the process there is obtained a board-component assemblage. The assemblage as shown in FIGURE 8 is inserted into molten solder so that only the component leads 24 and the portion of the pins 14 adjacent thereto project into the molten solder 26. When the assemblage is removed the solder clinging thereto cools and provides an electrical and mechanical connection between the component leads and the adjacent portions of the associated pins. Although the process step is shown as dip soldering, it should be apparent that other soldering techniques are equally applicable. In a fully automated system, wave soldering would be ideal.

After this final soldering step, any hybrid or other discrete components can be added to the board and any further test performed.

Although no means have been shown to provide for external connections to the board, it is apparent that conventional connectors will be provided. The wires destined for these connectors are wired by the above mentioned technique to additional pins, which have printed circuit connections to the actual connector.

Many imporrtant advantages accrue from the making of electrical circuit assemblies according to the invention. In particular, a high density of components can be mounted on a single board. For example, several hundred components can be mounted on a board of moderate size. The patterns actually printed on the boards furnish only the voltage interconnections and a way of getting the leads off the board. Therefore, when using a component such as an integrated circuit having standardized voltage terminals, a single type of printed board sufficies for all systems. Therefore, there is only one extremely simple art work operation. If the components are integrated circuits, no complicatd mounting techniques are required as is the usual case. The mounting is performed in a single soldering operation. Changes in signal or logic connections can be made in the field with simple hand operated devices. Furthermore, by using any suitable tip probe, every pin becomes a test point. These can easily be located because of the orderly grid structure. In fact, map coordinates may be incorporated directly in the printed circuit art work. The use of printed ground and operating voltage connections afford voltage planes having excellent noise immunity. In addition, the three dimensional nature of the wiring exploits many of the advantages usually obtained from multilayer printed circuit boards, without the initial cost required to develop the pattern for such boards. However, the manner of construction allows the multilayer technique to be used for quantity production. This packaging system, since it acts as a multi pin plug, may be plugged into a mating socket where all points are available, and therefore lends itself to automatic testing, i.e., the pins may be selectively energized to exercise the logic and the appropriate points may be sampled.

There will now be obvious to those skilled in the art many modifications and variations satisfying many or all of the objects of the invention and to which accrue many of the advantages associated therewith. However, these modifications and variations will not depart from the spirit of the invention as defined in the appended claims.

What is claimed is:

1. The method of making an electric circuit assemblage comprising the steps of making printed circuit electrical patterns on both sides of a board of insulative material, inserting pins according to a geometric pattern in the board so that some of the pins extend outwardly in mutually parallel relationship from each side of the board and certain of the pins contact the printed circuit pattern on one side of said board, immersing the printed board and pins in molten solder to tin the pins and establish a fixed electrical connection between said certain pins and the printed circuit pattern, making further electrical connections between further certain pins extending from said one side of the board by means of wires, positioning plural components each having a body and at least a pair of leads between other portions of pairs of the pins extending from the other side of the board in such a manner that the body of the component is adjacent said other side of the board and the pair of leads extend away from said other side at substantially right angles to said body and parallel to said other portions of the pair of pins respectively with the surfaces of said leads longitudinally and resiliently pressing outward against the surfaces of said other portions of the pair of pins to maintain the components in said position only through the frictional engagement between the resiliently abutting surfaces of said leads and said pins to establish a board-component assemblage, inserting said assemblage into molten solder so that only the component leads and the portions of the pins in longitudinal abutment therewith project into the molten solder, and removing the assemblage from the molten solder so that fixed electrical and mechanical connections are established between the leads and the adjacent portions of the associated pins.

2. The method of claim 1 wherein said board is perforated and said pins frictionally fitted into the perforations.

3. The method of claim 1 comprising the further step of testing the electrical connections between the pins after making the electrical connections and before the positioning of the components.

4. The method of claim 1 wherein the components are maintained in said position by adhesive contact between the body and the portion of the board opposite thereto.

References Cited

UNITED STATES PATENTS

| | | | |
|---|---|---|---|
| 2,927,251 | 3/1960 | Jones et al. | 29—626 XR |
| 3,013,187 | 12/1961 | Wyma et al. | 317—101 |
| 3,061,760 | 10/1962 | Ezzo | 317—101 XR |
| 3,222,760 | 12/1965 | Antalek | 29—626 XR |
| 3,247,575 | 4/1966 | Parstorfer | 29—627 |
| 3,296,099 | 1/1967 | Dinella | 174—68.5 XR |
| 3,314,128 | 4/1967 | Schutze et al. | 29—626 |
| 2,774,051 | 12/1956 | McCarthy | 339—147 |
| 2,884,612 | 4/1959 | Bang. | |
| 3,088,191 | 5/1963 | Breiling | 29—626 XR |
| 3,001,106 | 9/1951 | Higgs. | |

JOHN F. CAMPBELL, Primary Examiner

ROBERT W. CHURCH, Assistant Examiner

29—593; 174—52.5, 68.5; 317—101; 339—017